(12) United States Patent
Kawashima

(10) Patent No.: US 11,450,647 B2
(45) Date of Patent: Sep. 20, 2022

(54) SEMICONDUCTOR MODULE AND SEMICONDUCTOR DEVICE INCLUDING THE SAME

(71) Applicant: DENSO CORPORATION, Kariya (JP)

(72) Inventor: Takanori Kawashima, Anjo (JP)

(73) Assignee: DENSO CORPORATION, Kariya (JP)

( * ) Notice: Subject to any disclaimer, the term of this patent is extended or adjusted under 35 U.S.C. 154(b) by 212 days.

(21) Appl. No.: 16/776,736

(22) Filed: Jan. 30, 2020

(65) Prior Publication Data
US 2020/0286866 A1 Sep. 10, 2020

(30) Foreign Application Priority Data
Mar. 5, 2019 (JP) .............................. JP2019-039906

(51) Int. Cl.
*H01L 25/07* (2006.01)
*H01L 23/31* (2006.01)
*H01L 23/373* (2006.01)
*H01L 23/367* (2006.01)
*H02P 27/06* (2006.01)

(52) U.S. Cl.
CPC ........ *H01L 25/072* (2013.01); *H01L 23/3121* (2013.01); *H01L 23/367* (2013.01); *H01L 23/3735* (2013.01); *H02P 27/06* (2013.01)

(58) Field of Classification Search
None
See application file for complete search history.

(56) References Cited

U.S. PATENT DOCUMENTS

| 2007/0216013 A1* | 9/2007 | Funakoshi ............ H01L 24/33 257/691 |
| 2007/0267739 A1 | 11/2007 | Kajiwara et al. |
| 2009/0321924 A1* | 12/2009 | Funakoshi .......... H01L 23/4735 257/722 |
| 2010/0133667 A1* | 6/2010 | Oka .................. H01L 23/49517 257/666 |
| 2013/0307156 A1 | 11/2013 | Bayerer |
| 2014/0151864 A1 | 6/2014 | Taylor et al. |

(Continued)

FOREIGN PATENT DOCUMENTS

| JP | H8-162567 A | 6/1996 |
| JP | 2007-311441 A | 11/2007 |

(Continued)

*Primary Examiner* — Michelle Mandala
*Assistant Examiner* — Jordan M Klein
(74) *Attorney, Agent, or Firm* — Oliff PLC

(57) ABSTRACT

A semiconductor module disclosed herein may include: a first semiconductor element; an encapsulant that encapsulates the first semiconductor element; and a first stacked substrate on which the first semiconductor element is disposed, wherein the first stacked substrate may include a first insulator substrate, a first inner conductive layer and a first outer conductive layer, the first inner conductive layer being disposed on one side relative to the first insulator substrate, and the first outer conductive layer being disposed on another side relative to the first insulator substrate; the first inner conductive layer may be electrically connected to the first semiconductor element inside the encapsulant; and a part of the first inner conductive layer may be located outside the encapsulant and be configured to enable an external member to be bonded to the part.

18 Claims, 9 Drawing Sheets

(56) References Cited

U.S. PATENT DOCUMENTS

| | | | | |
|---|---|---|---|---|
| 2014/0159216 A1* | 6/2014 | Ishino | ............... | H01L 23/4006 |
| | | | | 257/675 |
| 2015/0340350 A1* | 11/2015 | Koga | .................... | H01L 24/33 |
| | | | | 257/713 |
| 2018/0082921 A1 | 3/2018 | Grassmann et al. | | |
| 2019/0164913 A1* | 5/2019 | Sakakibara | .......... | H01L 23/562 |
| 2019/0259690 A1* | 8/2019 | Kawashima | ....... | H01L 25/0657 |

FOREIGN PATENT DOCUMENTS

| JP | 2008-041752 A | 2/2008 |
|---|---|---|
| JP | 2010-010504 A | 1/2010 |
| JP | 2010-129795 A | 6/2010 |
| JP | 2010-232365 A | 10/2010 |
| JP | 2018-107481 A | 7/2018 |

\* cited by examiner

SEMICONDUCTOR MODULE AND SEMICONDUCTOR DEVICE INCLUDING THE SAME

CROSS-REFERENCE TO RELATED APPLICATION

This application claims priority to Japanese Patent Application No. 2019-039906, filed on Mar. 5, 2019, contents of which are incorporated herein by reference.

TECHNICAL FIELD

The technology disclosed herein relates to a semiconductor module and a semiconductor device including the same.

BACKGROUND

Japanese Patent Application Publication No. 2008-041752 describes a semiconductor module. This semiconductor module includes a semiconductor element, an encapsulant that encapsulates the semiconductor element, and a stacked substrate on which the semiconductor element is disposed. The stacked substrate includes an insulator substrate, an inner conductive layer located on one side of the insulator substrate, and an outer conductive layer located on another side of the insulator substrate.

SUMMARY

The above-described semiconductor module is further provided with a lead to be electrically connected to an external member (e.g., a bus bar or a circuit board). The lead is electrically connected to the semiconductor element inside the encapsulant, and protrudes from the encapsulant toward an outside thereof. Such a lead has conventionally been indispensable for a semiconductor module that includes a semiconductor element encapsulated in an encapsulant. In contrast to this, the present disclosure provides a technology capable of simplifying a configuration of a semiconductor module by eliminating a need of such a lead.

A semiconductor module disclosed herein may comprise: a first semiconductor element; an encapsulant that encapsulates the first semiconductor element; and a first stacked substrate on which the first semiconductor element is disposed, wherein the first stacked substrate may comprise a first insulator substrate, a first inner conductive layer and a first outer conductive layer, the first inner conductive layer being disposed on one side relative to the first insulator substrate, and the first outer conductive layer being disposed on another side relative to the first insulator substrate; the first inner conductive layer may be electrically connected to the first semiconductor element inside the encapsulant; and a part of the first inner conductive layer may be located outside the encapsulant and be configured to enable an external member to be bonded to the part.

DETAILED DESCRIPTION

Figure 1:
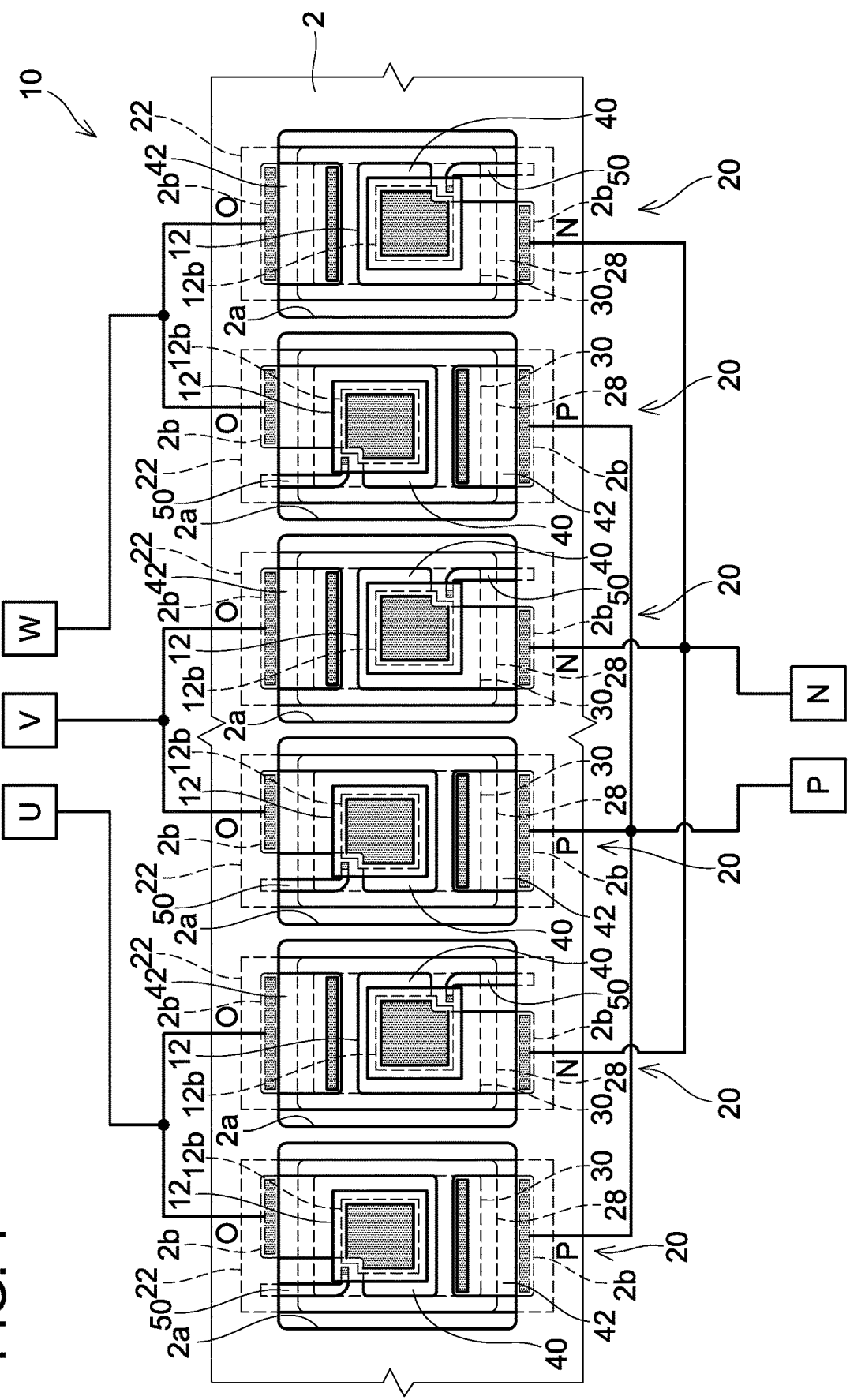
FIG. 1 is a schematic diagram showing a configuration of a semiconductor device 10 of a first embodiment. It should be noted that illustrations of coolers 4, an encapsulant 18, and outer conductive layers 26, 32 are omitted to clearly show electrical connections and an internal structure of semiconductor modules 20. Moreover, second inner conductive layers 30 and second insulator substrates 28 are illustrated by dashed lines. Bonded sites between constituent members are dotted. These also apply to FIGS. 4, 7, and 8.

In an embodiment of the present technology, a semiconductor module may comprise: a first semiconductor element; an encapsulant that encapsulates the first semiconductor element; and a first stacked substrate on which the first semiconductor element is disposed, wherein the first stacked substrate may comprise a first insulator substrate, a first inner conductive layer and a first outer conductive layer, the first inner conductive layer being disposed on one side of the first insulator substrate, and the first outer conductive layer being disposed on another side of the first insulator substrate; the first inner conductive layer may be electrically connected to the first semiconductor element inside the encapsulant; and a part of the first inner conductive layer may be located outside the encapsulant and be configured to enable an external member to be bonded to the part.

In the above-described semiconductor module, the part of the first inner conductive layer is located outside the encapsulant and is configured to enable the external member to be bonded to the part. This enables the first inner conductive layer to be bonded directly to the external member (e.g., a bus bar or a circuit board) without, for example, a lead interposed therebetween. Since a lead is not necessarily required, the configuration of the semiconductor module can be relatively simplified.

In an embodiment of the present technology, the first semiconductor element of the semiconductor module may include a first main electrode and a second main electrode, and the first inner conductive layer may include a first partial region and a second partial region which are independent of each other. In this case, the first partial region may be electrically connected to the first main electrode inside the encapsulant, and a part of the first partial region may be located outside the encapsulant. Additionally, the second partial region may be electrically connected to the second main electrode inside the encapsulant, and a part of the second partial region may be located outside the encapsulant. Such a configuration enables the first main electrode and the second main electrode of the first semiconductor element to be independently bonded to the same external member or bonded to different external members respectively without, for example, a lead. The first main electrode and the second main electrode herein described mean electrodes electrically connected to each other via the semiconductor substrate.

Additionally, the part of the first partial region located outside the encapsulant may be located on one side relative to the encapsulant, and the part of the second partial region located outside the encapsulant may be located on another side relative to the encapsulant. In other words, the first partial region and the second partial region may be exposed to the outside on opposite sides relative to the encapsulant. Such a configuration enables the first partial region and the second partial region to be designed relatively freely without interference with each other.

Additionally or alternatively, the first main electrode may be located on one surface of the first semiconductor element, and the second main electrode may be located on another surface of the first semiconductor element. In other words, the semiconductor module can adopt a semiconductor element having a vertical structure.

In an embodiment of the present technology, the semiconductor module may further include a second stacked substrate opposed to the first stacked substrate with the first semiconductor element interposed therebetween. In this case, the second stacked substrate may include a second insulator substrate, a second inner conductive layer located on one side of the second insulator substrate, and a second outer conductive layer located on another side of the second insulator substrate. Additionally, the second inner conductive layer may be electrically connected to each of the second main electrode of the first semiconductor element and the second partial region of the first inner conductive layer, inside the encapsulant. Additionally, the second partial region of the first inner conductive layer may be electrically connected to the second main electrode of the first semiconductor element via the second inner conductive layer. Such a configuration enables heat of the first semiconductor element to be dissipated from both sides of the semiconductor module via the two stacked substrates. The first outer conductive layer and the second outer conductive layer may be each exposed to the outside of the encapsulant, such that heat of the first semiconductor element can be dissipated effectively.

Additionally, a size of the first insulator substrate may be larger than a size of the second insulator substrate. Such a configuration enables the first inner conductive layer of the first stacked substrate to be bonded to the external member without interference with the second insulator substrate.

In an embodiment of the present technology, an entirety of the second inner conductive layer of the semiconductor module may be located inside the encapsulant. Such a configuration prevents the second inner conductive layer from coming into contact with the external member when the external member is bonded to the first inner conductive layer. Therefore, a short circuit between the external member and the second inner conductive layer can be avoided.

In an embodiment of the present technology, the semiconductor module may further comprise a second semiconductor element that is located between the first stacked substrate and the second stacked substrate and is encapsulated by the encapsulant, wherein the first inner conductive layer of the first stacked substrate may further comprise a third partial region that is independent of the first partial region and the second partial region, and is electrically connected to the second semiconductor element, the second inner conductive layer of the second stacked substrate may comprise: a fourth partial region electrically connected to the first semiconductor element; and a fifth partial region independent of the fourth partial region and electrically connected to the second semiconductor element, a part of the third partial region of the first inner conductive layer may be located outside the encapsulant and be configured to enable an external member to be bonded thereto, and the fifth partial region of the second inner conductive layer may be electrically connected to the first partial region of the first inner conductive layer, inside the encapsulant.

In addition to the above, in the first inner conductive layer, the part of the third partial region located outside the encapsulant may be located on a same side relative to the encapsulant as the part of the first partial region located outside the encapsulant or the part of the second partial region located outside the encapsulant.

In an embodiment of the present technology, the first semiconductor element of the semiconductor module may further include a signal electrode having a smaller size than the first main electrode and the second main electrode. In this case, the first inner conductive layer may further include a first signal circuit region independent of the first partial region and the second partial region. Additionally, the first signal circuit region may be electrically connected to the signal electrode inside the encapsulant, and a part of the first signal circuit region may be located outside the encapsulant and be configured to enable an external member to be bonded thereto. Such a configuration also enables the signal electrode of the first semiconductor element to be bonded directly to the external member without, for example, a lead interposed therebetween.

Additionally, the first signal circuit region may include a first end electrically connected to the signal electrode and a second end located outside the encapsulant, and the first signal circuit region may extend from the first end to the second end. In this case, a width of the second end of the first signal circuit region may be larger than a width of the first end of the first signal circuit region. In such a configuration, the larger width of the signal circuit region allows the signal circuit region to be bonded easily to the external member, even when the signal electrode is small.

In an embodiment of the present technology, each of the first semiconductor element and the second semiconductor element of the semiconductor module may further include a signal electrode, and the first inner conductive layer may further include a first signal circuit region and a second signal circuit region that are independent of the first partial region and the second partial region. In this case, the first signal circuit region may be electrically connected to the signal electrode of the first semiconductor element inside the encapsulant, and a part of the first signal circuit region may be located outside the encapsulant and configured to enable an external member to be bonded thereto. Additionally, the second signal circuit region may be electrically connected to the signal electrode of the second semiconductor element inside the encapsulant, and a part of the second signal circuit region may be located outside the encapsulant and configured to enable an external member to be bonded thereto. Additionally, the part of the first signal circuit region located outside the encapsulant and the part of the second signal circuit region located outside the encapsulant may be located on a same side relative to the encapsulant as the part of the first partial region located outside the encapsulant, and extend along both sides of the first insulator substrate, respectively. Such a configuration enables a design with a relatively wide spacing between the first signal circuit region and the second signal circuit region, and accordingly enables a design with relatively wide spacings between the first partial region and each of the two signal circuit regions. This can suppress noise, surge interference, oscillation, or the like caused by, for example, interactions between the first partial region and each of the two signal circuit regions.

In an embodiment of the present technology, in the part of the first inner conductive layer located outside the encapsulant, a bonding area to be bonded to the external member may be defined. In this case, the bonding area may include at least one of a concave portion opposed to the external member and a convex portion protruding toward the external member. With such a configuration, when the first inner conductive layer and the external member are bonded with a bonding material such as solder, excessive spreading of the bonding material can be suppressed. In other words, spreading of the bonding material beyond the bonding area can be suppressed because the bonding material is accommodated in the concave portion or is subjected to surface tension at an edge defined by the concave portion or the convex portion.

Additionally or alternatively, in the part of the first inner conductive layer located outside the encapsulant, a bonding area to be bonded to the external member may be defined. In this case, a groove, a wall, a plurality of holes, or a plurality of projections may be provided along at least a part of a boundary of the bonding area. In such a configuration, when a bonding material spreads along the first inner conductive layer, the groove, the wall, the plurality of holes, or the plurality of projections can accommodate or block the bonding material at the boundary of the bonding area. Therefore, excessive spreading of the bonding material beyond the bonding area of the first inner conductive layer can be suppressed.

In an embodiment of the present technology, a semiconductor device may comprise: the semiconductor module as described above, and a circuit board on which the semiconductor module is disposed, wherein the part of the first inner conductive layer located outside the encapsulant may be electrically connected to the circuit board.

The first insulator substrate of the semiconductor module may be disposed in parallel with the circuit board. Such a configuration enables downsizing of the semiconductor device.

Additionally, an opening may be provided in the circuit board, and the semiconductor module may be fixed to the circuit board such that at least a part thereof is located in the opening. Such a configuration enables further downsizing of the semiconductor device.

Additionally, at least a part of the encapsulant of the semiconductor module may be located in the opening of the circuit board. In this case, the first stacked substrate of the semiconductor module may extend over the opening of the circuit board in at least one direction. Additionally, one or more bonding portions between the first inner conductive layer of the first stacked substrate and the circuit board may be located along a periphery of the opening. In such a configuration, the first stacked substrate extends over the opening of the circuit board, such that the semiconductor module is stably supported by the circuit board.

Additionally, the semiconductor device may further include at least one cooler disposed adjacent to the semiconductor module. In this case, the at least one cooler may be disposed on one side of the semiconductor module or on both sides of the semiconductor module.

Representative, non-limiting examples of the present disclosure will now be described in further detail with reference to the attached drawings. This detailed description is merely intended to teach a person of skill in the art further details for practicing aspects of the present teachings and is not intended to limit the scope of the present disclosure. Furthermore, each of the additional features and teachings disclosed below may be utilized separately or in conjunction with other features and teachings to provide improved semiconductor modules and semiconductor devices including the same, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Embodiments

First Embodiment

With reference to FIGS. 1 to 8, semiconductor modules 20 of a first embodiment and a semiconductor device 10 including the same will be described. The semiconductor device 10 is a type of a power converter and can convert electric power between a direct-current power source 6 and a load (e.g., a motor M). The semiconductor device 10 can be adopted in an electric-powered vehicle such as an electric vehicle, a hybrid vehicle, or a fuel-cell vehicle.

Figure 2:
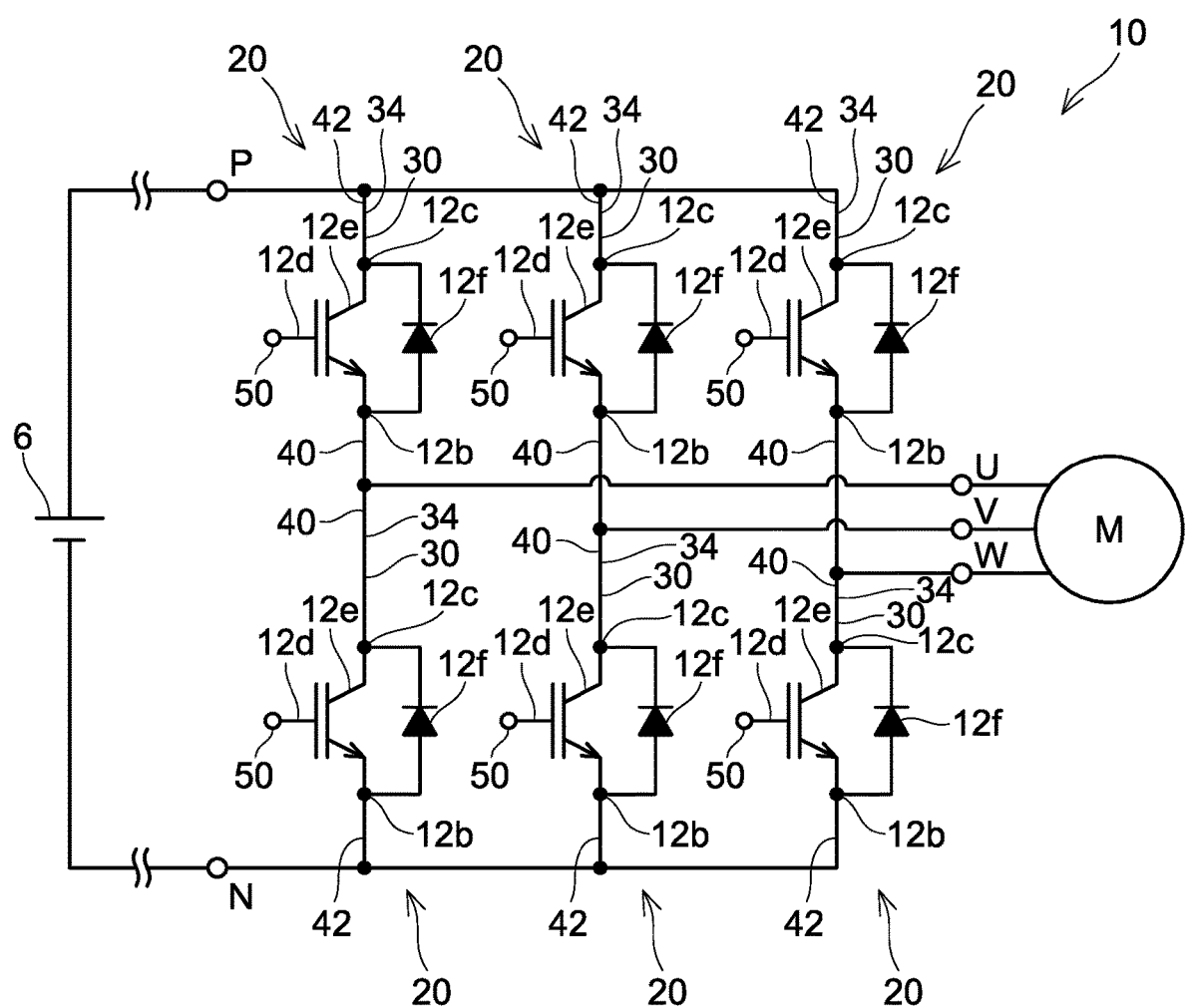
FIG. 2 is a circuit diagram showing the configuration of the semiconductor device 10.
Figure 3:
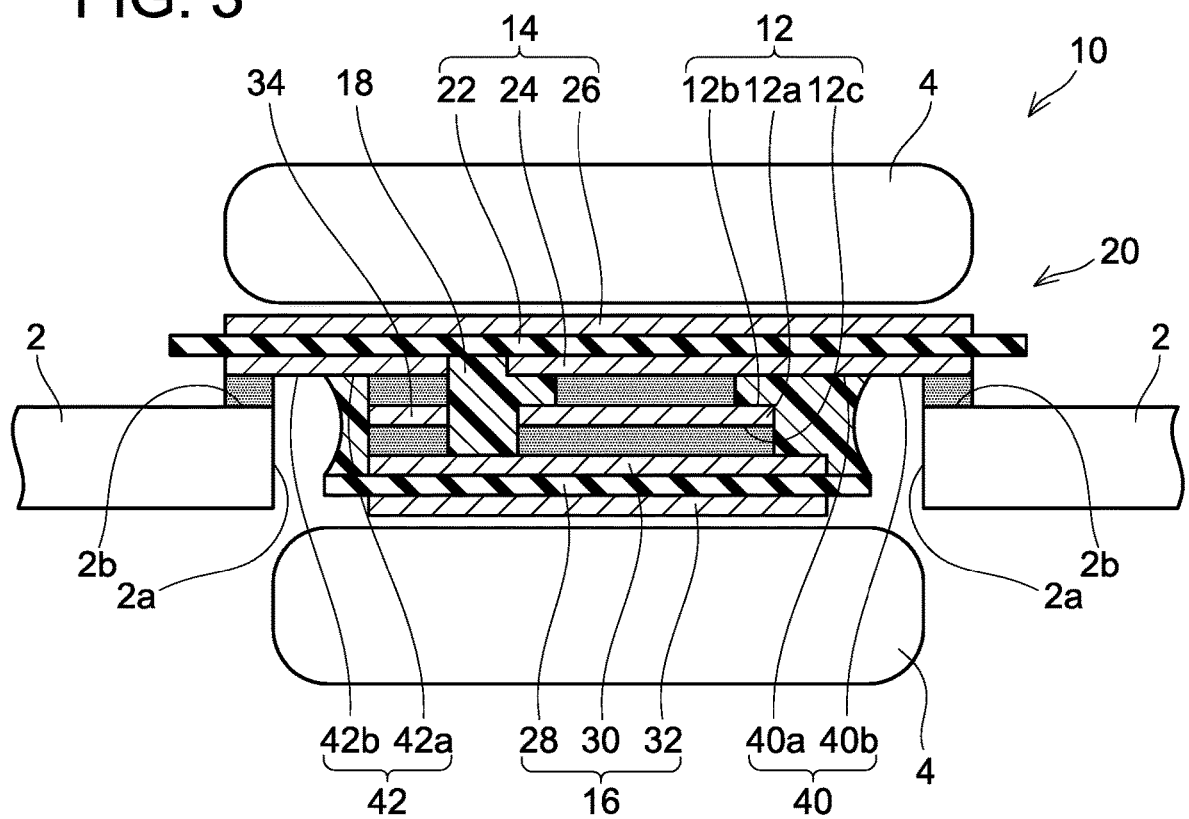
FIG. 3 is a cross-sectional view showing an internal structure of the semiconductor device 10.

As shown in FIGS. 1 to 3, the semiconductor device 10 includes a plurality of semiconductor modules 20, a circuit board 2 on which the semiconductor modules 20 are mounted, and a plurality of coolers 4 configured to cool the plurality of semiconductor modules 20. The circuit board 2 has a plurality of openings 2a provided therein. Each opening 2a has corresponding one of the semiconductor modules 20 disposed therein. The circuit board 2 is provided with a plurality of bonding portions 2b along peripheries of the openings 2a. The plurality of bonding portions 2b has the semiconductor modules 20 electrically connected thereto. The plurality of semiconductor modules 20 is thereby electrically connected to one another via the circuit board 2. As an example, the semiconductor device 10 of the present embodiment includes six semiconductor modules 20, and these semiconductor modules 20 configure a three-phase (a U-phase, a V-phase, a W-phase) inverter circuit (see FIG. 2). The semiconductor device 10 may include a DC-DC converter circuit in addition to or in place of the inverter circuit. The DC-DC converter circuit can be configured with at least one semiconductor module 20.

Along both sides of each semiconductor module 20, the coolers 4 are disposed. It should be noted that specific configurations of the coolers 4 are not particularly limited. Each of the plurality of coolers 4 may be disposed only on one side of each semiconductor module 20. Moreover, each of the coolers 4 may be configured to cool only one of the semiconductor modules 20, or collectively cool some of or all the semiconductor modules 20.

As shown in FIG. 3, each semiconductor module 20 is located in the corresponding opening 2a of the circuit board 2. The semiconductor module 20 includes a semiconductor element 12, a first stacked substrate 14, a second stacked substrate 16, and an encapsulant 18. The semiconductor element 12 is disposed between the first stacked substrate 14 and the second stacked substrate 16. The semiconductor element 12 is encapsulated inside the encapsulant 18. The encapsulant 18 is mainly constituted of an insulating material. As an example, the encapsulant 18 can be mainly constituted of a thermosetting resin material such as an epoxy resin.

The first stacked substrate 14 includes a first insulator substrate 22, a first inner conductive layer 24 provided on one side relative to the first insulator substrate 22, and a first outer conductive layer 26 provided on another side relative to the first insulator substrate 22. Similarly, the second stacked substrate 16 includes a second insulator substrate 28, a second inner conductive layer 30 provided on one side relative to the second insulator substrate 28, and a second outer conductive layer 32 provided on another side relative to the second insulator substrate 28. The first inner conductive layer 24 of the first stacked substrate 14 is configured to be bondable to the bonding portions 2b of the circuit board 2 outside the encapsulant 18. A size of the first insulator substrate 22 is larger than a size of the second insulator substrate 28, and the first stacked substrate 14 extends over the opening 2a of the circuit board 2. Moreover, the first inner conductive layer 24 is electrically connected to the semiconductor element 12 inside the encapsulant 18. Similarly, the second inner conductive layer 30 is electrically connected to the semiconductor element 12 inside the encapsulant 18.

Figure 4:
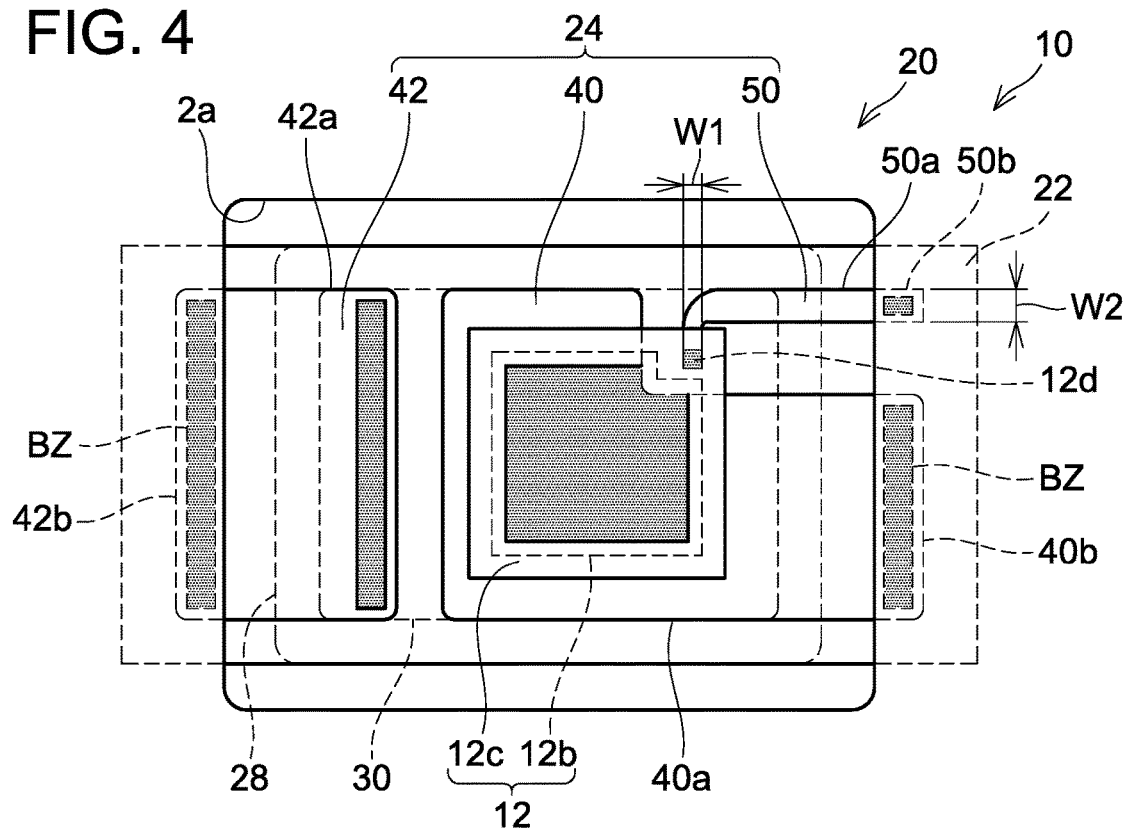
FIG. 4 is a bottom view showing the internal structure of the semiconductor device 10.

With reference to FIGS. 2, 3, and 4, the semiconductor elements 12 will be described. Each semiconductor element 12 is a power semiconductor element and includes a semiconductor substrate 12a and a plurality of electrodes 12b, 12c, 12d. The plurality of electrodes 12b, 12c, 12d includes a first main electrode 12b and a second main electrode 12c that are connected to a power circuit, and a signal electrode 12d connected to a signal circuit. The semiconductor element 12 is a switching element and can electrically connect and disconnect the first main electrode 12b and the second main electrode 12c, although not particularly limited so. The first main electrode 12b and the signal electrode 12d are located on one surface of the semiconductor substrate 12a, and the second main electrode 12c is located on another surface of the semiconductor substrate 12a. In other words, the semiconductor module 20 can adopt the semiconductor element 12 having a vertical structure. It should be noted that the semiconductor element 12 is not limited to a vertical structure. The semiconductor module 20 may adopt the semiconductor element 12 having a so-called horizontal structure in which, for example, both the first main electrode 12b and the second main electrode 12c are located on one surface of the semiconductor substrate 12a.

The semiconductor element 12 of the present embodiment includes an Insulated Gate Bipolar Transistor (IGBT) structure 12e, but is not particularly limited so. The first main electrode 12b is connected to an emitter of the IGBT structure 12e, the second main electrode 12c is connected to a collector of the IGBT structure 12e, and the signal electrode 12d is connected to a gate of the IGBT structure 12e. Additionally, the semiconductor element 12 includes a diode structure 12f connected in parallel with the IGBT structure 12e. The first main electrode 12b is connected to an anode of the diode structure 12f, and the second main electrode 12c is connected to a cathode of the diode structure 12f. As another embodiment, the semiconductor element 12 may include a Metal-Oxide-Semiconductor Field-Effect Transistor (MOSFET) structure. In this case, the first main electrode 12b is connected to a source of the MOSFET structure, the second main electrode 12c is connected to a drain of the MOSFET structure, and the signal electrode 12d is connected to a gate of the MOSFET structure.

The first inner conductive layer 24 includes a plurality of partial regions 40, 42 that are independent of each other on the first insulator substrate 22. The plurality of partial regions 40, 42 includes a first partial region 40 and a second partial region 42. The first partial region 40 includes a first inner partial region 40a located inside the encapsulant 18, and a first outer partial region 40b located outside the encapsulant 18. Similarly, the second partial region 42 includes a second inner partial region 42a located inside the encapsulant 18, and a second outer partial region 42b located outside the encapsulant 18.

The first inner partial region 40a of the first inner conductive layer 24 is electrically connected to the first main electrode 12b of the semiconductor element 12, and the second inner conductive layer 30 is electrically connected to the second main electrode 12c of the semiconductor element 12. Moreover, the second inner partial region 42a of the first inner conductive layer 24 is electrically connected to the second inner conductive layer 30. The second inner partial region 42a is thereby electrically connected to the second main electrode 12c of the semiconductor element 12 via the second inner conductive layer 30. A conductive spacer 34 is interposed between the second inner partial region 42a and the second inner conductive layer 30, but this is not necessarily required. Moreover, electrical connections between the constituent members are realized by using a bonding material having electrical conductivity, such as solder. It should be noted that these connections are not limited to those realized by using a bonding material, and may be realized by another aspect.

The first outer partial region 40b and the second outer partial region 42b of the first inner conductive layer 24 are each bonded to the circuit board 2. The semiconductor module 20 is thereby electrically connected to a power circuit provided at the circuit board 2. In the semiconductor device 10, two semiconductor modules 20 are connected in series. Specifically, the first outer partial region 40b of one of the two semiconductor modules 20 and the second outer partial region 42b of the other one of the two semiconductor modules 20 are electrically connected to each other. Moreover, the second outer partial region 42b of the one of the two semiconductor modules 20 is connected to a positive electrode of the direct-current power source 6, and the first outer partial region 40b of the other one of the two semiconductor modules 20 is connected to a negative electrode of the direct-current power source 6.

Additionally, the first outer partial region 40b is located on one side relative to the encapsulant 18, and the second outer partial region 42b is located on another side relative to the encapsulant 18. Such a configuration enables the first partial region 40 and the second partial region 42 to be designed relatively freely without interference with each other.

Moreover, the plurality of partial regions of the first inner conductive layer 24 also includes a signal circuit region 50 independent of the first partial region 40 and the second partial region 42. Similarly to the first partial region 40, the signal circuit region 50 includes an inner signal circuit region 50a located inside the encapsulant 18, and an outer signal circuit region 50b located outside the encapsulant 18. The inner signal circuit region 50a is electrically connected to the signal electrode 12d of the semiconductor element 12. The outer signal circuit region 50b is configured to be bondable to the circuit board 2 and is electrically connected to a signal circuit provided at the circuit board 2.

The signal circuit region 50 includes a first end electrically connected to the signal electrode 12d in the inner signal circuit region 50a, and a second end located in the outer signal circuit region 50b. The signal circuit region 50 extends from the first end to the second end. In this case, a width W2 of the signal circuit region 50 at the second end is larger than a width W1 of the signal circuit region 50 at the first end. In such a configuration, the larger width W2 of the signal circuit region 50 allows the signal circuit region 50 to be bonded easily to the circuit board 2, even when the signal electrode 12d is small.

Here, electrical connections between the first inner conductive layer 24 and the circuit board 2 are realized by using a bonding material having electrical conductivity, such as solder. It should be noted that these connections are not limited to those realized by using a bonding material, and may be realized by another aspect.

Moreover, in the semiconductor device 10 of the present embodiment, the first outer conductive layers 26 and the second outer conductive layers 32 are each exposed to the outside of the encapsulant 18. Heat of the semiconductor elements 12 is thereby dissipated effectively. As described above, the coolers 4 are disposed adjacent to both sides (i.e., the outer conductive layers 26, 32) of each semiconductor module 20.

As an example, the first stacked substrate 14 and the second stacked substrate 16 of the present embodiment are Direct Bonded Copper (DBC) substrates. The insulator substrates 22, 28 are mainly constituted of a ceramic material such as aluminum oxide, silicon nitride, and aluminum nitride. Moreover, the inner conductive layers 24, 30 and the outer conductive layers 26, 32 are constituted of copper. The stacked substrates 14, 16 are not limited to DBC substrates, and may be, for example, Direct Bonded Aluminum (DBA) substrates or Active Metal Brazed Copper (AMC) substrates. Alternatively, the insulator substrates 22, 28 may have a structure different from that of a DBC substrate, a DBA substrate, or an AMC substrate. The configuration of each of the stacked substrates 14, 16 is not particularly limited. The stacked substrates 14, 16 only need to include the insulator substrates 22, 28 constituted of an insulating material, and the inner conductive layers 24, 30 and the outer conductive layers 26, 32 constituted of a conductor such as a metal, respectively. Bonding structures between the first insulator substrate 22 and each of the conductive layers 24, 26 of the first stacked substrate 14, and between the insulator substrate 28 and each of the conductive layers 30, 32 of the second stacked substrate 16 are not particularly limited.

In the above-described semiconductor module 20, the first outer partial region 40b and the second outer partial region 42b of the first inner conductive layer 24 are each configured to be bondable to the circuit board 2. In other words, a part of the first inner conductive layer 24 is located outside the encapsulant 18 and is configured to enable the circuit board 2 to be bonded thereto. The first inner conductive layer 24 can thereby be bonded directly to the circuit board 2 without, for example, a lead interposed therebetween. Since a lead is not necessarily required, the configuration of the semiconductor module 20 can be relatively simplified.

In the semiconductor device 10 of the present embodiment, the semiconductor element 12 of each semiconductor module 20 includes the first main electrode 12b and the second main electrode 12c, and the first inner conductive layer 24 includes the first partial region 40 and the second partial region 42 which are independent of each other. In this case, the first partial region 40 is electrically connected to the first main electrode 12b inside the encapsulant 18, and a part of the first partial region 40 is located outside the encapsulant 18. Additionally, the second partial region 42 is electrically connected to the second main electrode 12c inside the encapsulant 18, and a part of the second partial region 42 is located outside the encapsulant 18. Such a configuration enables the first main electrode 12b and the second main electrode 12c of the semiconductor element 12 to be independently bonded to the same circuit board 2 or different circuit boards 2, without, for example, a lead.

In the semiconductor device 10 of the present embodiment, each semiconductor module 20 further includes the second stacked substrate 16 opposed to the first stacked substrate 14 with the semiconductor element 12 interposed therebetween. The second inner conductive layer 30 is electrically connected to each of the second main electrode 12c of the semiconductor element 12 and the second partial region 42 of the first inner conductive layer 24, inside the encapsulant 18. The second partial region 42 of the first inner conductive layer 24 is electrically connected to the second main electrode 12c of the semiconductor element 12 via the second inner conductive layer 30. Such a configuration enables heat of the semiconductor element 12 to be dissipated from both sides of the semiconductor module 20 via the two stacked substrates 14, 16.

In the semiconductor device 10 of the present embodiment, a size of the first insulator substrates 22 is larger than a size of the second insulator substrates 28. Such a configuration enables the first inner conductive layers 24 of the first stacked substrates 14 to be bonded to the circuit board 2 without interference with the second insulator substrates 28.

As described above, a part of each first inner conductive layer 24 is located outside the encapsulant 18. On the other hand, an entirety of each second inner conductive layer 30 is located inside the encapsulant 18. Such a configuration prevents the second inner conductive layers 30 from coming into contact with the circuit board 2 when the circuit board 2 is bonded to the first inner conductive layers 24. Therefore, a short circuit between the circuit board 2 and the second inner conductive layers 30 can be avoided.

In the semiconductor device 10 of the present embodiment, the semiconductor element 12 of each semiconductor module 20 further includes the signal electrode 12d having a smaller size than the first main electrode 12b and the second main electrode 12c (see FIG. 4). Moreover, the first inner conductive layer 24 may further include the signal circuit region 50 independent of the first partial region 40 and the second partial region 42, the signal circuit region 50 may be electrically connected to the signal electrode 12d inside the encapsulant 18, and a part of the signal circuit region 50 may be located outside the encapsulant 18 and be configured to enable the circuit board 2 to be bonded thereto. Such a configuration also enables the signal electrodes 12d of the semiconductor elements 12 to be bonded directly to the circuit board 2 without, for example, a lead interposed therebetween.

Figure 5:
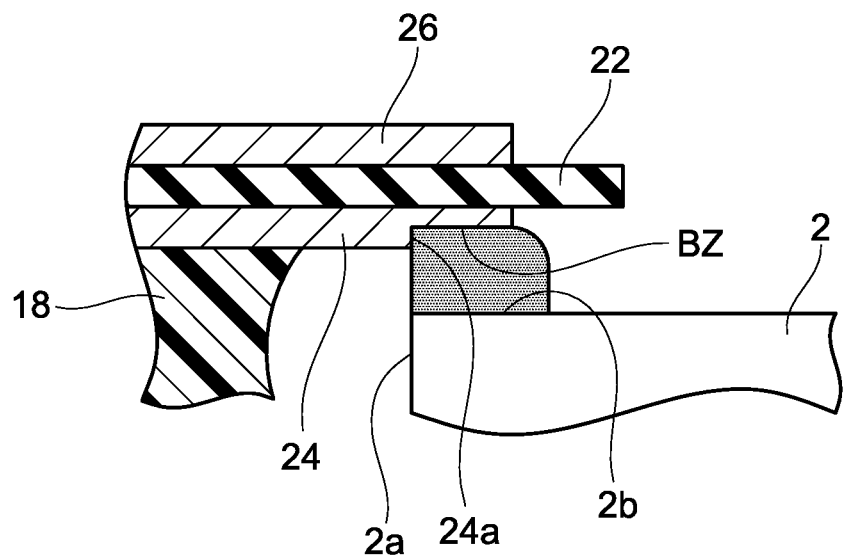
FIG. 5 is a cross-sectional view showing a variant of outer partial regions 40b, 42b, 50b of a first inner conductive layer 24.
Figure 6:
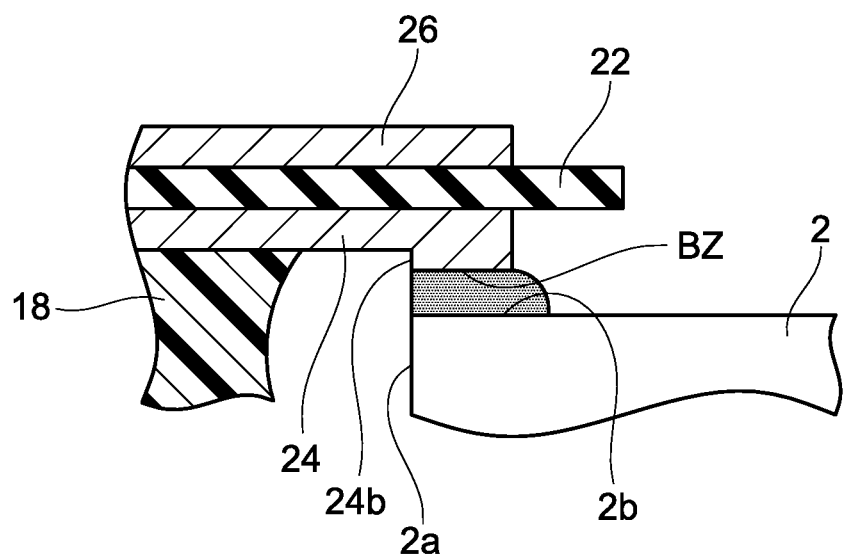
FIG. 6 is a cross-sectional view showing another variant of the outer partial regions 40b, 42b, 50b of the first inner conductive layer 24.
Figure 7:
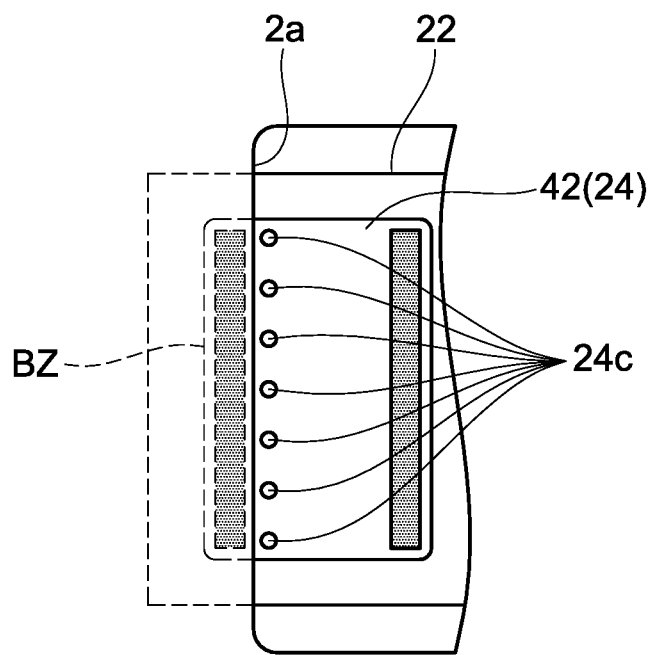
FIG. 7 is a bottom view showing still another variant of the outer partial regions 40b, 42b, 50b of the first inner conductive layer 24.

As shown in FIGS. 3 and 4, in the semiconductor device 10 of the present embodiment, each of the outer partial regions 40b, 42b, 50b of the first inner conductive layer 24, which are located outside the encapsulant 18, has a surface having a flat shape. Each of the outer partial regions 40b, 42b, 50b is not limited to having such a flat shape, and can be modified variously. With reference to FIGS. 5 to 7, other variations of the outer partial regions 40b, 42b, 50b will be described. In each of the outer partial regions 40b, 42b, 50b, a bonding area BZ to be bonded to the circuit board 2 is defined. As shown in FIG. 5, each bonding area BZ may include a concave portion 24a opposed to the circuit board 2. Such a configuration can suppress excessive spreading of a bonding material, such as solder, when the first inner conductive layer 24 and the circuit board 2 are bonded with the bonding material. In other words, spreading of the bonding material beyond the bonding area BZ can be suppressed because the bonding material is accommodated in the concave portion 24a and/or is subjected to surface tension at an edge defined by the concave portion 24a. Alternatively, as shown in FIG. 6, each bonding area BZ may include a convex portion 24b protruding toward the circuit board 2. In this case, surface tension at an edge defined by the convex portion 24b can suppress spreading of the bonding material beyond the bonding area BZ.

As shown in FIG. 7, each of the outer partial regions 40b, 42b, 50b may have a plurality of holes 24c provided therein along a boundary of the bonding area BZ. In this case, the plurality of holes 24c only needs to be provided along at least a part of the boundary of the bonding area BZ. With such a configuration, when the bonding material spreads along the first inner conductive layer 24, the plurality of holes can accommodate or block the bonding material at the boundary of the bonding area BZ. Therefore, excessive spreading of the bonding material beyond the bonding areas BZ of the first inner conductive layer 24 is suppressed. A shape and the number of the plurality of holes 24c are not particularly limited. A groove, a wall, or a plurality of projections may be provided in place of the plurality of holes 24c.

Figure 8:
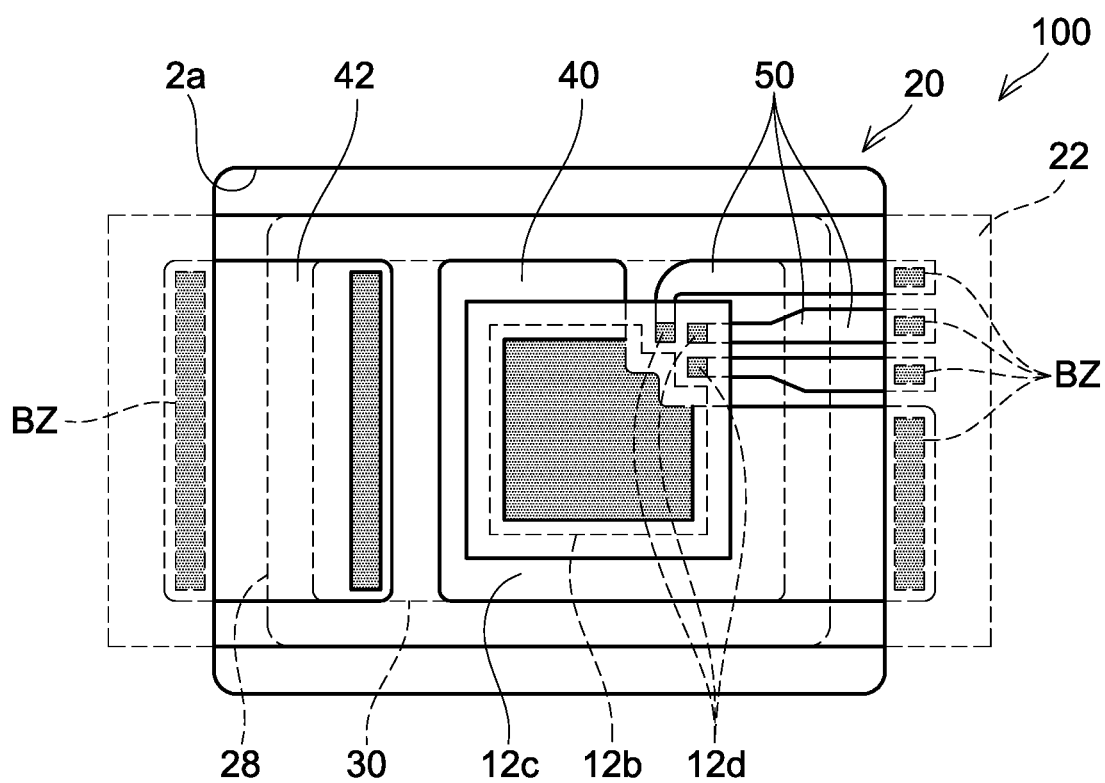
FIG. 8 is a bottom view showing other configurations of signal electrodes 12d and signal circuit regions 50 of the first inner conductive layer 24.

In the semiconductor device 10 of the present embodiment, each semiconductor element 12 includes one signal electrode 12d. Therefore, the first inner conductive layer 24 also includes one signal circuit region 50. It should be noted that the numbers of the signal electrodes 12d and the signal circuit regions 50 are not limited thereto. As shown in FIG. 8, the number of the signal electrodes 12d and the number of the signal circuit regions 50 connected thereto may be plural.

In the semiconductor device 10 of the present embodiment, the first insulator substrate 22 of each semiconductor module 20 is disposed in parallel with the circuit board 2. Such a configuration enables downsizing of the semiconductor device 10.

In the semiconductor device 10 of the present embodiment, the openings 2a are provided in the circuit board 2, and each semiconductor module 20 is fixed to the circuit board 2 such that at least a part thereof is located in the corresponding opening 2a. Such a configuration enables further downsizing of the semiconductor device 10.

Additionally, at least a part of the encapsulant 18 of each semiconductor module 20 is located in the opening 2a of the circuit board 2. Additionally, the first stacked substrate 14 of each semiconductor module 20 extends over the opening 2a of the circuit board 2 in at least one direction. Additionally, one or more bonding portions 2b between the first inner conductive layers 24 of the first stacked substrates 14 and the circuit board 2 are located along peripheries of the openings 2a. In such a configuration, the first stacked substrates 14 extend over the openings 2a of the circuit board 2, such that the semiconductor modules 20 are stably supported by the circuit board 2.

In the semiconductor device 10 of the present embodiment, the plurality of semiconductor modules 20 is disposed on the single circuit board 2. However, as another embodiment, the semiconductor device 10 may include a plurality of circuit boards, and one or more semiconductor modules 20 may be disposed on each of the circuit boards. Alternatively, each semiconductor module 20 may be connected to the plurality of circuit boards. In other words, in each semiconductor module 20, the first outer partial region 40b and the second outer partial region 42b may be connected to different circuit boards.

Second Embodiment

Figure 9:
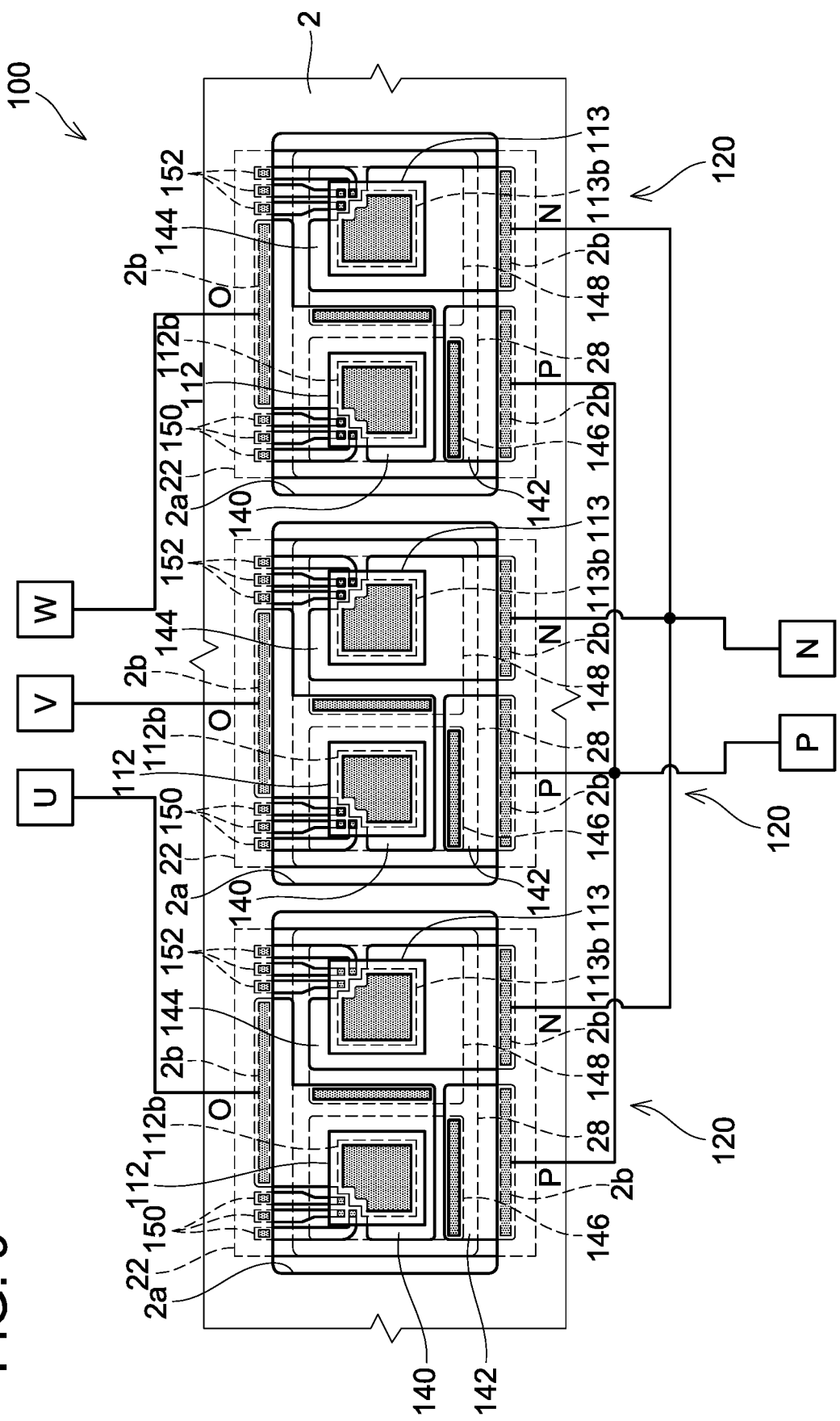
FIG. 9 is a schematic diagram showing a configuration of a semiconductor device 100 of a second embodiment. It should be noted that illustrations of the coolers 4, the encapsulant 18, and the outer conductive layers 26, 32 are omitted to clearly show electrical connections and an internal structure of semiconductor modules 120. Moreover, second inner conductive layers 130 and the second insulator substrates 28 are illustrated by dashed lines. Bonded sites between constituent members are dotted. These also apply to FIG. 11.
Figure 10:
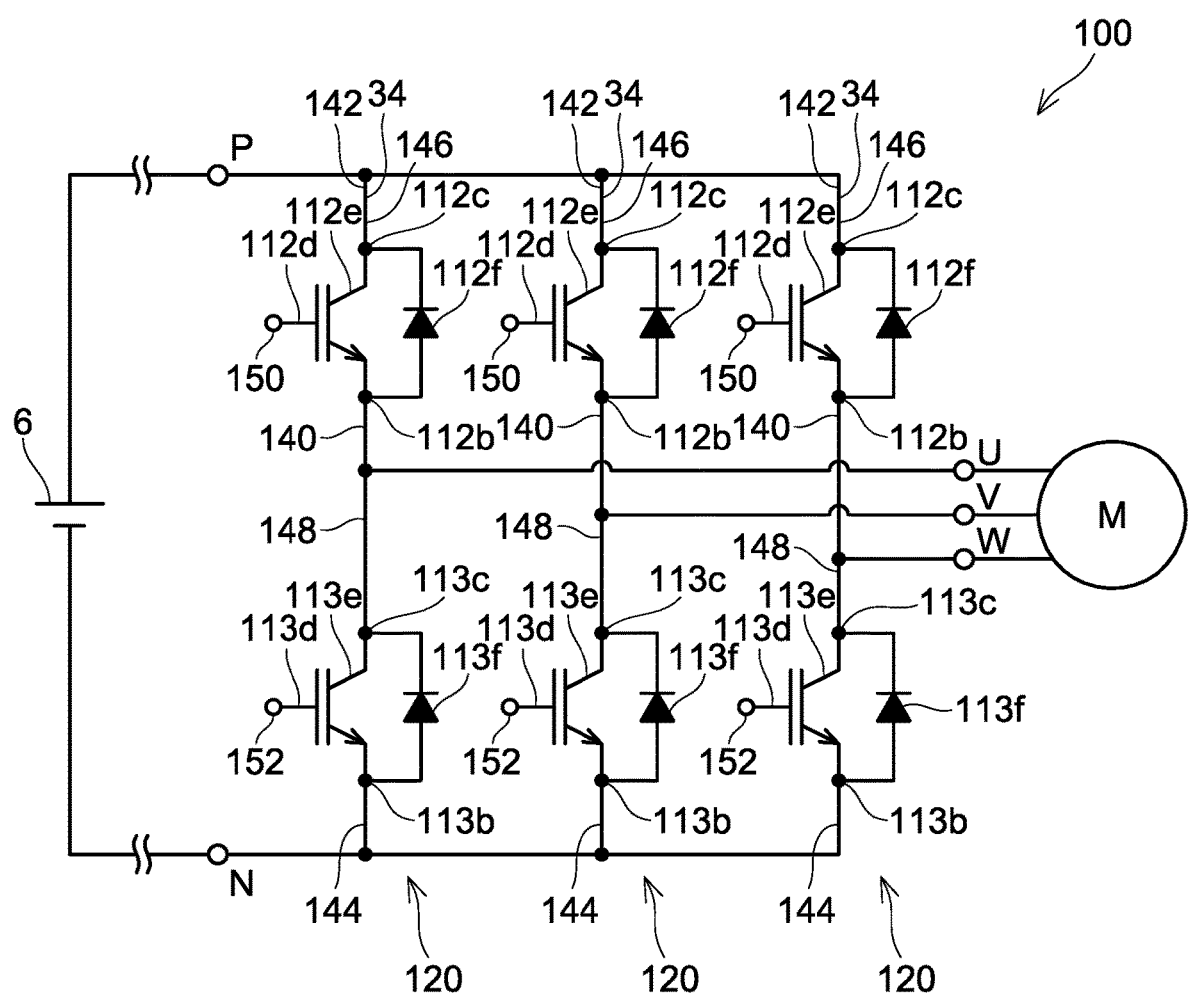
FIG. 10 is a circuit diagram showing the configuration of the semiconductor device 100.
Figure 11:
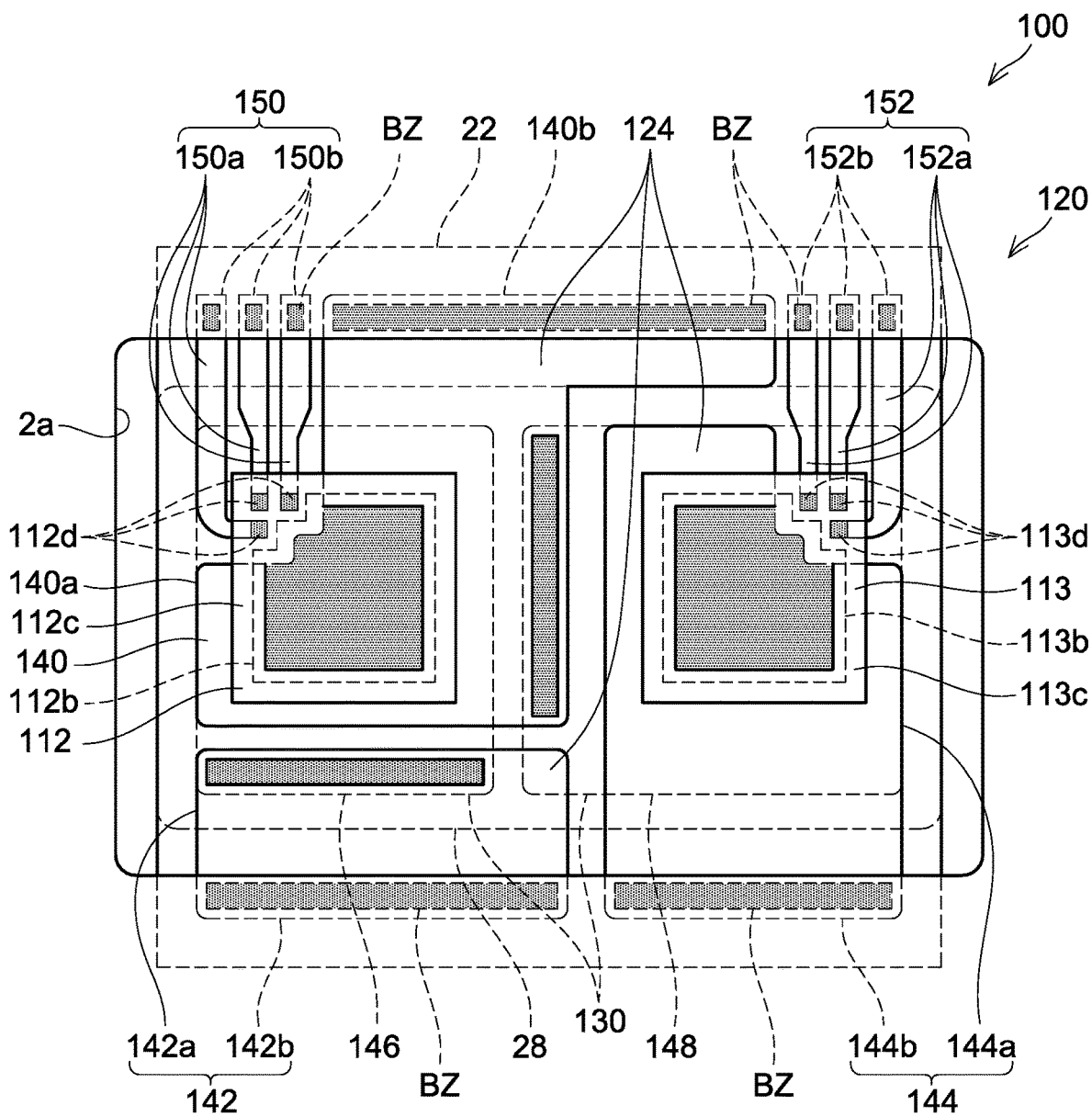
FIG. 11 is a bottom view showing an internal structure of the semiconductor device 100.

With reference to FIGS. 9 to 11, semiconductor modules 120 of a second embodiment and a semiconductor device 100 including the same will be described. As shown in FIGS. 9 and 10, the semiconductor device 100 includes a plurality of semiconductor modules 120, the circuit board 2 on which the semiconductor modules 120 are mounted, and a cooler (not shown) configured to cool the semiconductor modules 120. In comparison with semiconductor modules 20 of the first embodiment that each include one semiconductor element, the semiconductor modules 120 of the present embodiment each includes two semiconductor elements 112, 113. Structures of inner conductive layers 124, 130 of the first stacked substrate 14 and the second stacked substrate 16 are modified accordingly. In the semiconductor device 100 of the present embodiment, therefore, the three-phase inverter circuit is configured with only three semiconductor modules 120.

As shown in FIG. 11, each semiconductor module 120 includes the first semiconductor element 112 and the second semiconductor element 113, the first stacked substrate 14 and the second stacked substrate 16, and the encapsulant 18. The first semiconductor element 112 and the second semiconductor element 113 are located between the first stacked substrate 14 and the second stacked substrate 16. The second semiconductor element 113 is disposed on the same plane as the first semiconductor element 112, and is disposed in an orientation that is rotated by 90 degrees about a central axis of the first semiconductor element 112. Both the first semiconductor element 112 and the second semiconductor element 113 are encapsulated in the encapsulant 18. Other configurations are the same as those of the semiconductor module 20 of the first embodiment, and hence will not herein be described again.

The first semiconductor element 112 is a power semiconductor element, and includes a semiconductor substrate and a plurality of electrodes 112b, 112c, 112d. The plurality of electrodes 112b, 112c, 112d includes a first main electrode 112b and a second main electrode 112c that are connected to a power circuit, and a plurality of signal electrodes 112d connected to a signal circuit. As in the first embodiment, the first semiconductor element 112 of the present embodiment is a switching element, and includes an IGBT structure 112e. The first main electrode 112b is connected to an emitter of the IGBT structure 112e, the second main electrode 112c is connected to a collector of the IGBT structure 112e, and the signal electrodes 112d are connected to a gate of the IGBT structure 112e. Additionally, the first semiconductor element 112 includes a diode structure 112f connected in parallel with the IGBT structure 112e. The first main electrode 112b is connected to an anode of the diode structure 112f, and the second main electrode 112c is connected to a cathode of the diode structure 112f.

Similarly, the second semiconductor element 113 is a power semiconductor element, and includes a semiconductor substrate and a plurality of electrodes 113b, 113c, 113d. The plurality of electrodes 113b, 113c, 113d includes a first main electrode 113b and a second main electrode 113c that are connected to the power circuit, and a plurality of signal electrodes 113d connected to the signal circuit. As in the first embodiment, the second semiconductor element 113 of the present embodiment is a switching element, and includes an IGBT structure 113e. The first main electrode 113b is connected to an emitter of the IGBT structure 113e, the second main electrode 113c is connected to a collector of the IGBT structure 113e, and the signal electrodes 113d are connected to a gate of the IGBT structure 113e. Additionally, the second semiconductor element 113 includes a diode structure 113f connected in parallel with the IGBT structure 113e. The first main electrode 113b is connected to an anode of the diode structure 113f, and the second main electrode 113c is connected to a cathode of the diode structure 113f.

With reference to FIG. 11, the first inner conductive layer 124 and the second inner conductive layer 130 of the present embodiment will be described. The first inner conductive layer 124 and the second inner conductive layer 130 are electrically connected to the semiconductor elements 112, 113 inside the encapsulant 18. Additionally, a part of the first inner conductive layer 124 is located outside the encapsulant 18 and is configured to be bondable to the circuit board 2. On the other hand, an entirety of the second inner conductive layer 130 is located inside the encapsulant 18. The first inner conductive layer 124 includes a plurality of partial regions which are independent of one another on the first insulator substrate 22. The plurality of partial regions includes a first partial region 140 and a second partial region 142, and additionally a third partial region 144. The first partial region 140 and the second partial region 142 are electrically connected to the first semiconductor element 112, and the third partial region 144 is electrically connected to the second semiconductor element 113.

The first partial region 140 includes a first inner partial region 140a located inside the encapsulant 18 and a first outer partial region 140b located outside the encapsulant 18. Similarly, the second partial region 142 includes a second inner partial region 142a located inside the encapsulant 18 and a second outer partial region 142b located outside the encapsulant 18. Similarly, the third partial region 144 includes a third inner partial region 144a located inside the encapsulant 18 and a third outer partial region 144b located outside the encapsulant 18.

The second inner conductive layer 130 includes a plurality of partial regions 146, 148 which are independent of each other on the second insulator substrate 28. The plurality of partial regions 146, 148 includes a fourth partial region 146 and a fifth partial region 148. The fourth partial region 146 is electrically connected to the first semiconductor element 112, and the fifth partial region 148 is electrically connected to the second semiconductor element 113. An entirety of each of these partial regions 146, 148 is located inside the encapsulant 18.

The first inner partial region 140a of the first inner conductive layer 124 is electrically connected to the first main electrode 112b of the first semiconductor element 112, and the fourth partial region 146 of the second inner conductive layer 130 is electrically connected to the second main electrode 112c of the first semiconductor element 112. The second inner partial region 142a of the first inner conductive layer 124 is electrically connected to the fourth partial region 146 of the second inner conductive layer 130. The second inner partial region 142a is thereby electrically connected to the second main electrode 112c of the semiconductor element 112 via the fourth partial region 146 of the second inner conductive layer 130. On the other hand, the third inner partial region 144a of the first inner conductive layer 124 is electrically connected to the first main electrode 113b of the second semiconductor element 113, and the fifth partial region 148 of the second inner conductive layer 130 is electrically connected to the second main electrode 113c of the second semiconductor element 113. Additionally, the first inner partial region 140a and the fifth partial region 148 are electrically connected. The first semiconductor element 112 and the second semiconductor element 113 are thereby connected in series. The conductive spacer 34 is interposed between the second inner partial region 142a and the second inner conductive layer 130, but this is not necessarily required. Moreover, electrical connections between the constituent members are realized by using a bonding material having electrical conductivity, such as solder. It should be noted that these connections are not limited to those realized by using a bonding material, and may be realized by another aspect.

The plurality of outer partial regions 140b, 142b, 144b of the first inner conductive layer 124 is bonded to the circuit board 2. The semiconductor module 120 is thereby electrically connected to the power circuit provided at the circuit board 2. In the semiconductor device 100, the two semiconductor elements 112, 113 are connected in series in each semiconductor module 120. Specifically, the first inner partial region 140a and the fifth partial region 148 are electrically connected to each other. The first outer partial region 140b is connected to a load (the motor M here). Moreover, the second outer partial region 142b is connected to the positive electrode of the direct-current power source 6, and the third outer partial region 144b is connected to the negative electrode of the direct-current power source 6.

As in the semiconductor module 20 of the first embodiment, the first outer partial region 140b is located on one side relative to the encapsulant 18, and the second outer partial region 142b is located on another side relative to the encapsulant 18. Such a configuration enables the first partial region 140 and the second partial region 142 to be designed relatively freely without interference with each other. Additionally, the third outer partial region 144b is located on the same side relative to the encapsulant 18 as the second outer partial region 142b. In the semiconductor module 120 of the present embodiment, in particular, the second outer partial region 142b connected to a high-potential side of the direct-current power source 6 and the third outer partial region 144b connected to a low-potential side of the direct-current power source 6 are disposed adjacent to each other. Magnetic fields formed by currents respectively flowing in the outer partial regions 142b, 144b are thereby canceled out each other, such that an inductance of the semiconductor module 120 is reduced.

The plurality of partial regions of the first inner conductive layer 124 further includes a plurality of first signal circuit regions 150 and a plurality of second signal circuit regions 152 that are independent of the first partial region 140, the second partial region 142, and the third partial region 144. Similarly to the first partial region 140, each of the first signal circuit regions 150 includes a first inner signal circuit region 150a located inside the encapsulant 18 and a first outer signal circuit region 150b located outside the encapsulant 18. The first inner signal circuit regions 150a are electrically connected to the signal electrodes 112d of the first semiconductor element 112. The first outer signal circuit regions 150b are configured to be bondable to the circuit board 2, and are electrically connected to the signal circuit provided at the circuit board 2. Each of the second signal circuit regions 152 includes a second inner signal circuit region 152a located inside the encapsulant 18 and a second outer signal circuit region 152b located outside the encapsulant 18. The second inner signal circuit regions 152a are electrically connected to the signal electrodes 113d of the second semiconductor element 113. The second outer signal circuit regions 152b are configured to be bondable to the circuit board 2, and are electrically connected to the signal circuit provided at the circuit board 2. Such a configuration also enables the plurality of signal electrodes 112d, 113d of the semiconductor elements 112, 113 to be bonded directly to the circuit board 2 without, for example, a lead interposed therebetween.

Additionally, the first outer signal circuit regions 150b of the first signal circuit regions 150 and the second outer signal circuit regions 152b of the second signal circuit regions 152 are located on the same side relative to the encapsulant 18 as the first outer partial region 140b, and extend along both sides of the first insulator substrate 22. Such a configuration enables a design with a relatively wide spacing between the first signal circuit regions 150 and the second signal circuit regions 152, and accordingly enables a design with relatively wide spacings between the first partial region 140 and each of the plurality of signal circuit regions 150 and the plurality of signal circuit regions 152. This can suppress noise, surge interference, oscillation, or the like caused by, for example, interactions between the first partial region 140 and each of the plurality of signal circuit regions 150 and the plurality of signal circuit regions 152.

As described above, in each semiconductor module 120, each of the first outer partial region 140b, the second outer partial region 142b, and the third outer partial region 144b of the first inner conductive layer 124 is configured to be bondable to the circuit board 2. In other words, a part of the first inner conductive layer 124 is located outside the encapsulant 18 and is configured to enable the circuit board 2 to be bonded thereto. The first inner conductive layer 124 can thereby be bonded directly to the circuit board 2 without, for example, a lead interposed therebetween. Since a lead is not necessarily required, the configuration of each semiconductor module 120 can be relatively simplified.

The embodiments of the semiconductor modules 20, 120 and the semiconductor devices 10, 100 including the same have been described above. These are mere examples, and the configuration of the semiconductor modules 20 can be modified variously. Semiconductor modules 60, 70, which are variants of the semiconductor modules 20, will hereinafter be described.

(First Variant)

Figure 12:
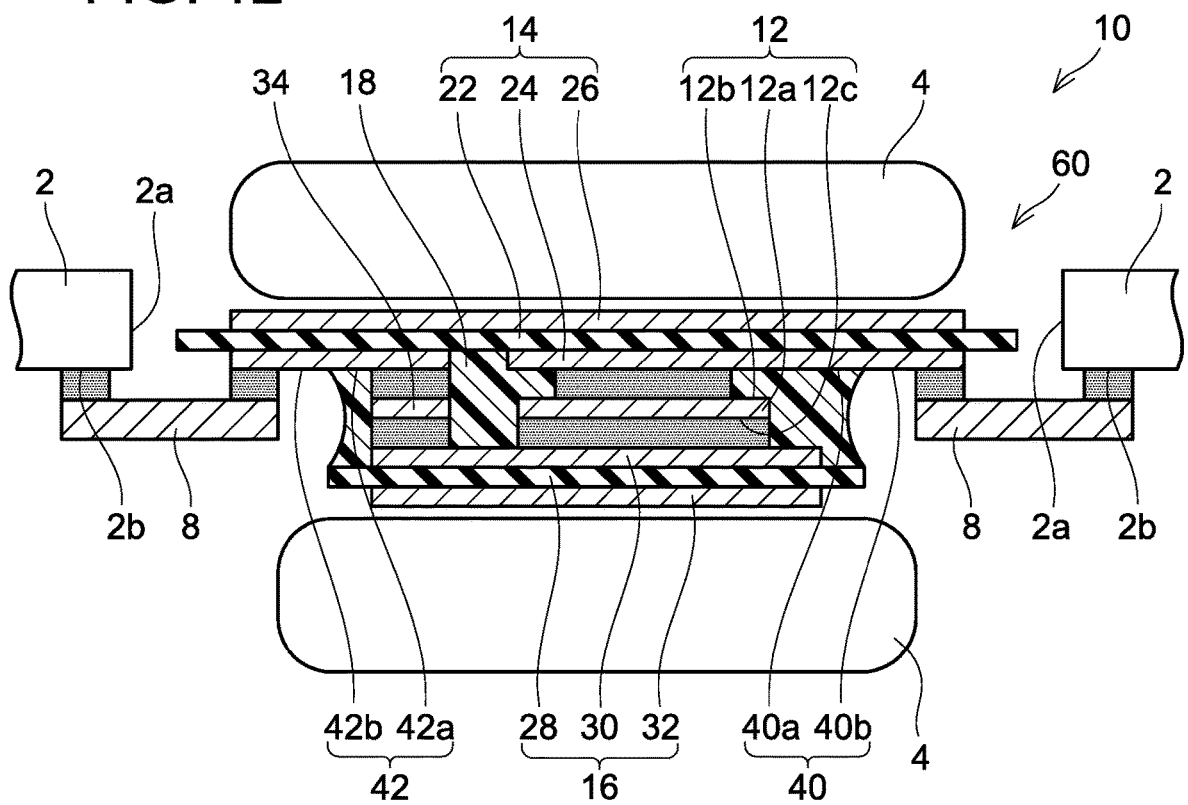
FIG. 12 is a cross-sectional view showing an internal structure of a first variant of the semiconductor module 20 (a semiconductor module 60).

In each semiconductor module 20 of the first embodiment, each of the outer partial regions 40b, 42b of the first inner conductive layer 24 is configured to enable the circuit board 2 to be bonded thereto. It should be noted that the circuit board 2 is an example of external member in the technology herein disclosed, and the external member is not particularly limited to the circuit board 2. As shown in FIG. 12, in the semiconductor module 60, the outer partial regions 40b, 42b of the first inner conductive layer 24 are configured to be bondable to a bridge member 8 (e.g., a bus bar) having electrical conductivity. Other configurations are the same as those of the first embodiment, and hence will not be described again. The bridge member 8 can be mainly constituted of a conductive material such as copper. In the case of the present variant as well, the configuration of the semiconductor module 60 can be relatively simplified. Moreover, in this case, in the semiconductor device 10, the outer partial regions 40b, 42b of the first inner conductive layer 24 may be bonded to the circuit board 2 via the bridge member 8. Such a configuration can achieve a relatively high degree of freedom in bonding, because a position or posture of the first inner conductive layer 24 is not fixed relative to the circuit board 2 when the first inner conductive layer 24 and the circuit board 2 are bonded. Moreover, spacing between the first inner conductive layer 24 and the circuit board 2 is widened, and hence a bonding work becomes relatively easy.

(Second Variant)

Figure 13:
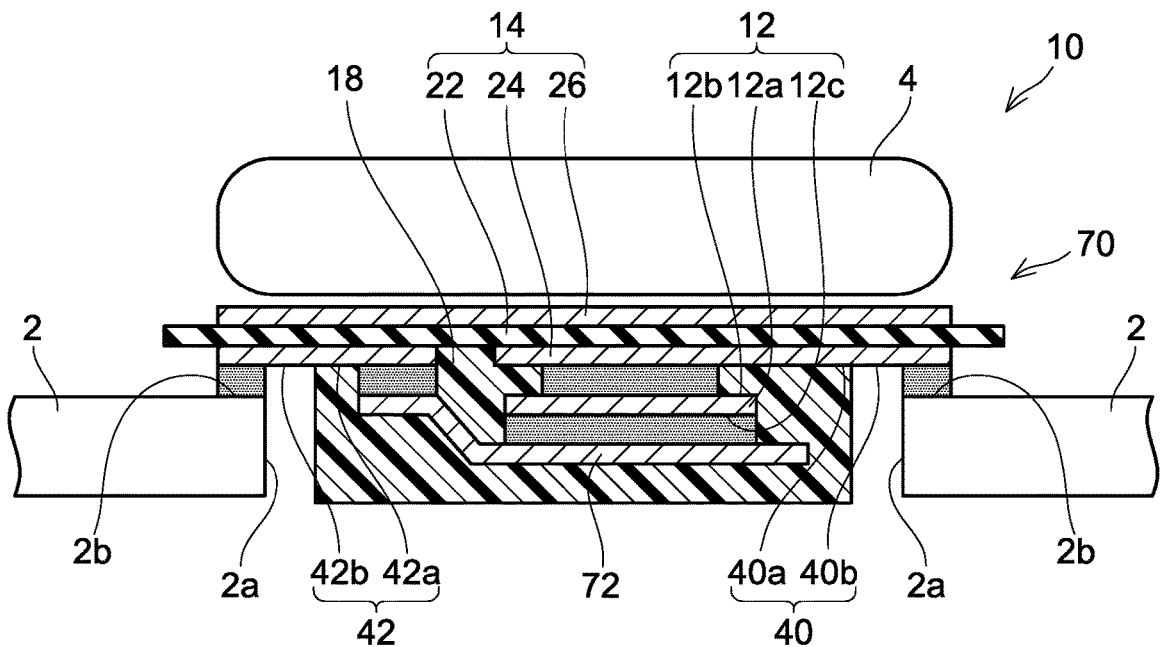
FIG. 13 is a cross-sectional view showing an internal structure of a second variant of the semiconductor module 20 (a semiconductor module 70).

As shown in FIG. 13, the semiconductor module 70 includes the first stacked substrate 14 and a conductive plate 72, whereas the first embodiment includes the two stacked substrates 14, 16. The conductive plate 72 is opposed to the first stacked substrate 14 with the semiconductor element 12 interposed therebetween. The conductive plate 72 is electrically connected to the semiconductor element 12 inside the encapsulant 18. Additionally, the second inner partial region 42a of the first inner conductive layer 24 is electrically connected to the semiconductor element 12 via the conductive plate 72. Other configurations are the same as those of the first embodiment, and hence will not be described again. In the case of the present variant as well, the configuration of the semiconductor module 70 can be relatively simplified.

In FIG. 13, the first stacked substrate 14 is opposed to the first main electrode 12b of the semiconductor element 12. As in the first embodiment, such a configuration allows the signal electrode 12d to be electrically connected to the signal circuit region 50 of the first inner conductive layer 24. Therefore, the conductive plate 72 is connected directly to the second main electrode 12c. The structure of the conductive plate 72 is thereby configured to be relatively simple. It should be noted that the configurations of the first stacked substrate 14 and the semiconductor element 12 are not limited to the above-described configurations. As an example, the first stacked substrate 14 may be opposed to the second main electrode 12c of the semiconductor element 12. Such a configuration allows the first inner partial region 40a to be connected directly to the second main electrode 12c. Here, the size of the second main electrode 12c is larger than the size of the first main electrode 12b provided on the same side as the signal electrode 12d. Therefore, heat of the semiconductor element 12 can be transferred effectively to the first outer conductive layer 26. In other words, heat of the semiconductor element 12 can be dissipated effectively.

What is claimed is:

1. A semiconductor module comprising:
   a first semiconductor element;
   an encapsulant that encapsulates the first semiconductor element; and
   a first stacked substrate on which the first semiconductor element is disposed,
   wherein:
   the first stacked substrate comprises a first insulator substrate, a first inner conductive layer and a first outer conductive layer, the first insulator substrate comprising a first surface and a second surface opposite to the first surface, the first inner conductive layer being disposed on the first surface of the first insulator substrate, and the first outer conductive layer being disposed on the second surface of the first insulator substrate;
   a part of the first surface of the first insulator substrate is located outside the encapsulant;
   the first inner conductive layer is electrically connected to the first semiconductor element inside the encapsulant;
   a part of the first inner conductive layer is located on the part of the first surface located outside the encapsulant and is configured to enable an external member to be bonded to the part;
   the first semiconductor element comprises a first main electrode and a second main electrode;
   the first inner conductive layer comprises a first partial region and a second partial region which are independent of each other;
   the first partial region is electrically connected to the first main electrode inside the encapsulant, and a part of the first partial region is located on the part of the first surface of the first insulator substrate located outside the encapsulant; and
   the second partial region is electrically connected to the second main electrode inside the encapsulant, and a part of the second partial region is located on the part of the first surface of the first insulator substrate located outside the encapsulant.

2. The semiconductor module according to claim 1, wherein
   the part of the first partial region located outside the encapsulant is located on one side relative to the encapsulant, and
   the part of the second partial region located outside the encapsulant is located on another side relative to the encapsulant.

3. The semiconductor module according to claim 1, wherein the first main electrode is located on one surface of the first semiconductor element, and the second main electrode is located on another surface of the first semiconductor element.

4. The semiconductor module according to claim 1, wherein
   in the part of the first inner conductive layer located on the part of the first surface of the first insulator substrate located outside the encapsulant, a bonding area to be bonded to the external member is defined, and
   the bonding area comprises at least one of a concave portion opposed to the external member and a convex portion protruding toward the external member.

5. The semiconductor module according to claim 1, wherein
   in the part of the first inner conductive layer located on the part of the first surface of the first insulator substrate located outside the encapsulant, a bonding area to be bonded to the external member is defined, and
   a groove, a wall, a plurality of holes, or a plurality of projections is provided along at least a part of a boundary of the bonding area.

6. A semiconductor device comprising:
   the semiconductor module according to claim 1, and
   a circuit board on which the semiconductor module is disposed,
   wherein
   the part of the first inner conductive layer located outside the encapsulant is electrically connected to the circuit board.

7. The semiconductor device according to claim 6, wherein the first insulator substrate of the semiconductor module is disposed in parallel with the circuit board.

8. The semiconductor device according to claim 7, wherein
   an opening is provided in the circuit board, and
   the semiconductor module is fixed to the circuit board such that at least a part thereof is located in the opening.

9. A semiconductor module comprising:
   a first semiconductor element;
   an encapsulant that encapsulates the first semiconductor element; and
   a first stacked substrate on which the first semiconductor element is disposed,
   wherein:
   the first stacked substrate comprises a first insulator substrate, a first inner conductive layer and a first outer conductive layer, the first inner conductive layer being disposed on one side relative to the first insulator substrate, and the first outer conductive layer being disposed on another side relative to the first insulator substrate;
   the first inner conductive layer is electrically connected to the first semiconductor element inside the encapsulant;
   a part of the first inner conductive layer is located outside the encapsulant and is configured to enable an external member to be bonded to the part;
   the first semiconductor element comprises a first main electrode and a second main electrode;
   the first inner conductive layer comprises a first partial region and a second partial region which are independent of each other;
   the first partial region is electrically connected to the first main electrode inside the encapsulant, and a part of the first partial region is located outside the encapsulant;
   the second partial region is electrically connected to the second main electrode inside the encapsulant, and a part of the second partial region is located outside the encapsulant;
   the first main electrode is located on one surface of the first semiconductor element, and the second main electrode is located on another surface of the first semiconductor element;
   the semiconductor module further comprises a second stacked substrate opposed to the first stacked substrate with the first semiconductor element interposed therebetween;
   the second stacked substrate comprises a second insulator substrate, a second inner conductive layer and a second outer conductive layer, the second inner conductive layer being disposed on one side relative to the second insulator substrate, and the second outer conductive layer being disposed on another side relative to the second insulator substrate;

the second inner conductive layer is electrically connected to each of the second main electrode of the first semiconductor element and the second partial region of the first inner conductive layer, inside the encapsulant; and the second partial region of the first inner conductive layer is electrically connected to the second main electrode of the first semiconductor element via the second inner conductive layer.

10. The semiconductor module according to claim 9, wherein a size of the first insulator substrate is larger than a size of the second insulator substrate.

11. The semiconductor module according to claim 9, wherein an entirety of the second inner conductive layer is located inside the encapsulant.

12. The semiconductor module according to claim 9, further comprising a second semiconductor element that is located between the first stacked substrate and the second stacked substrate and is encapsulated by the encapsulant, wherein the first inner conductive layer of the first stacked substrate further comprises a third partial region that is independent of the first partial region and the second partial region, and is electrically connected to the second semiconductor element, the second inner conductive layer of the second stacked substrate comprises:

a fourth partial region electrically connected to the first semiconductor element; and a fifth partial region independent of the fourth partial region and electrically connected to the second semiconductor element, a part of the third partial region of the first inner conductive layer is located outside the encapsulant and is configured to enable an external member to be bonded thereto, and the fifth partial region of the second inner conductive layer is electrically connected to the first partial region of the first inner conductive layer, inside the encapsulant.

13. The semiconductor module according to claim 12, wherein in the first inner conductive layer, the part of the third partial region located outside the encapsulant is located on a same side relative to the encapsulant as the part of the first partial region located outside the encapsulant or the part of the second partial region located outside the encapsulant.

14. The semiconductor module according to claim 12, wherein each of the first semiconductor element and the second semiconductor element further comprises a signal electrode, the first inner conductive layer further comprises a first signal circuit region and a second signal circuit region that are independent of the first partial region and the second partial region, the first signal circuit region is electrically connected to the signal electrode of the first semiconductor element inside the encapsulant, and a part of the first signal circuit region is located outside the encapsulant and configured to enable an external member to be bonded thereto, the second signal circuit region is electrically connected to the signal electrode of the second semiconductor element inside the encapsulant, and a part of the second signal circuit region is located outside the encapsulant and configured to enable an external member to be bonded thereto, the part of the first signal circuit region located outside the encapsulant and the part of the second signal circuit region located outside the encapsulant are located on a same side relative to the encapsulant as the part of the first partial region located outside the encapsulant, and extend along both sides of the first insulator substrate, respectively.

15. A semiconductor module comprising:

a first semiconductor element;

an encapsulant that encapsulates the first semiconductor element; and a first stacked substrate on which the first semiconductor element is disposed, wherein:

the first stacked substrate comprises a first insulator substrate, a first inner conductive layer and a first outer conductive layer, the first inner conductive layer being disposed on one side relative to the first insulator substrate, and the first outer conductive layer being disposed on another side relative to the first insulator substrate;

the first inner conductive layer is electrically connected to the first semiconductor element inside the encapsulant;

a part of the first inner conductive layer is located outside the encapsulant and is configured to enable an external member to be bonded to the part;

the first semiconductor element comprises a first main electrode and a second main electrode;

the first inner conductive layer comprises a first partial region and a second partial region which are independent of each other;

the first partial region is electrically connected to the first main electrode inside the encapsulant, and a part of the first partial region is located outside the encapsulant;

the second partial region is electrically connected to the second main electrode inside the encapsulant, and a part of the second partial region is located outside the encapsulant;

the first semiconductor element further comprises a signal electrode having a smaller size than the first main electrode and the second main electrode;

the first inner conductive layer further comprises a first signal circuit region independent of the first partial region and the second partial region;

the first signal circuit region is electrically connected to the signal electrode inside the encapsulant; and a part of the first signal circuit region is located outside the encapsulant and is configured to enable an external member to be bonded thereto.

16. The semiconductor module according to claim 15, wherein the first signal circuit region comprises a first end electrically connected to the signal electrode and a second end located outside the encapsulant, the first signal circuit region extending from the first end to the second end, and a width of the second end of the first signal circuit region is larger than a width of the first end of the first signal circuit region.

17. A semiconductor device comprising:

a semiconductor module comprising:

a first semiconductor element;

an encapsulant that encapsulates the first semiconductor element; and a first stacked substrate on which the first semiconductor element is disposed, the first stacked substrate comprising a first insulator substrate, a first inner conductive layer and a first outer conductive layer, the first inner conductive layer being disposed on one side relative to the first insulator substrate, and the first outer conductive layer being disposed on another side relative to the first insulator substrate, the first inner conductive layer being electrically connected to the first semiconductor element inside the encapsulant, and a part of the first inner conductive layer being located outside the encapsulant and being configured to enable an external member to be bonded to the part; and a circuit board on which the semiconductor module is disposed, wherein:

the part of the first inner conductive layer located outside the encapsulant is electrically connected to the circuit board;

the first insulator substrate of the semiconductor module is disposed in parallel with the circuit board;

an opening is provided in the circuit board;

the semiconductor module is fixed to the circuit board such that at least a part thereof is located in the opening;

at least a part of the encapsulant of the semiconductor module is located in the opening of the circuit board;

the first stacked substrate of the semiconductor module extends over the opening of the circuit board in at least one direction; and one or more bonding portions between the first inner conductive layer of the first stacked substrate and the circuit board are located along a periphery of the opening.

18. The semiconductor device according to claim 17, further comprising a cooler disposed adjacent to the semiconductor module.

* * * * *